United States Patent
Kameda et al.

(10) Patent No.: US 9,683,288 B2
(45) Date of Patent: *Jun. 20, 2017

(54) METHOD OF MANUFACTURING SEMICONDUCTOR DEVICE AND METHOD OF CLEANING PROCESSING VESSEL

(71) Applicants: HITACHI KOKUSAI ELECTRIC INC., Tokyo (JP); L'Air Liquide Societe Anonyme Pour L'Etude Et L'Exploitation Des Procedes Georges Claude, Paris (FR)

(72) Inventors: Kenji Kameda, Toyama (JP); Jun Sonobe, Tsukuba Ibaraki (JP); Yudai Tadaki, Tsukuba (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 588 days.

This patent is subject to a terminal disclaimer.

(21) Appl. No.: 14/184,051

(22) Filed: Feb. 19, 2014

(65) Prior Publication Data
US 2014/0235066 A1 Aug. 21, 2014

Related U.S. Application Data

(63) Continuation of application No. 13/089,988, filed on Apr. 19, 2011, now Pat. No. 8,679,259.

(30) Foreign Application Priority Data

Apr. 23, 2010 (JP) ................................. 2010-099984

(51) Int. Cl.
*B08B 9/00* (2006.01)
*C23C 16/44* (2006.01)
*H01L 21/02* (2006.01)

(52) U.S. Cl.
CPC .... *C23C 16/4405* (2013.01); *H01L 21/02271* (2013.01)

(58) Field of Classification Search
CPC ........... C23C 16/4405; H01L 21/02271; Y10S 438/905

(Continued)

(56) References Cited

U.S. PATENT DOCUMENTS

| 5,861,065 A | 1/1999 | Johnson | |
| 2005/0082002 A1* | 4/2005 | Sato | B08B 7/00 156/345.29 |
| 2009/0149032 A1* | 6/2009 | Kameda | C23C 16/4405 438/778 |

FOREIGN PATENT DOCUMENTS

| JP | 10-303186 A | 11/1998 |
| JP | 2001-089860 A | 4/2001 |

(Continued)

OTHER PUBLICATIONS

Decision on Examination, TW Application No. 100-114018, Jan. 20, 2016, 2 pages (English translation provided).

*Primary Examiner* — Douglas Lee
(74) *Attorney, Agent, or Firm* — Volpe and Koenig, P.C.

(57) ABSTRACT

When a dry cleaning process is performed in a processing chamber by adding nitrogen monoxide (NO) gas to a cleaning gas, the handling is facilitated, and cleaning performance is improved. A substrate processing apparatus includes a processing vessel configured to process a substrate, a first cleaning gas supply system configured to pre-mix a gas containing fluorine atoms with the NO gas and supply the pre-mixed gas into the processing vessel, and a second cleaning gas supply system installed apart from the first cleaning gas supply system and configured to supply the fluorine-containing gas into the processing vessel.

10 Claims, 3 Drawing Sheets

(58) Field of Classification Search
USPC .......................................... 134/22.1; 438/758
See application file for complete search history.

(56) References Cited

FOREIGN PATENT DOCUMENTS

| | | |
|---|---|---|
| JP | 2003-144905 A | 5/2003 |
| JP | 2003-347288 A | 12/2003 |
| JP | 2004-511088 A | 4/2004 |
| JP | 2005-085956 A | 3/2005 |
| JP | 2005-101583 A | 4/2005 |
| TW | 2009-33730 A | 8/2009 |
| WO | 02/25713 A1 | 3/2002 |

* cited by examiner

<Prior Art>

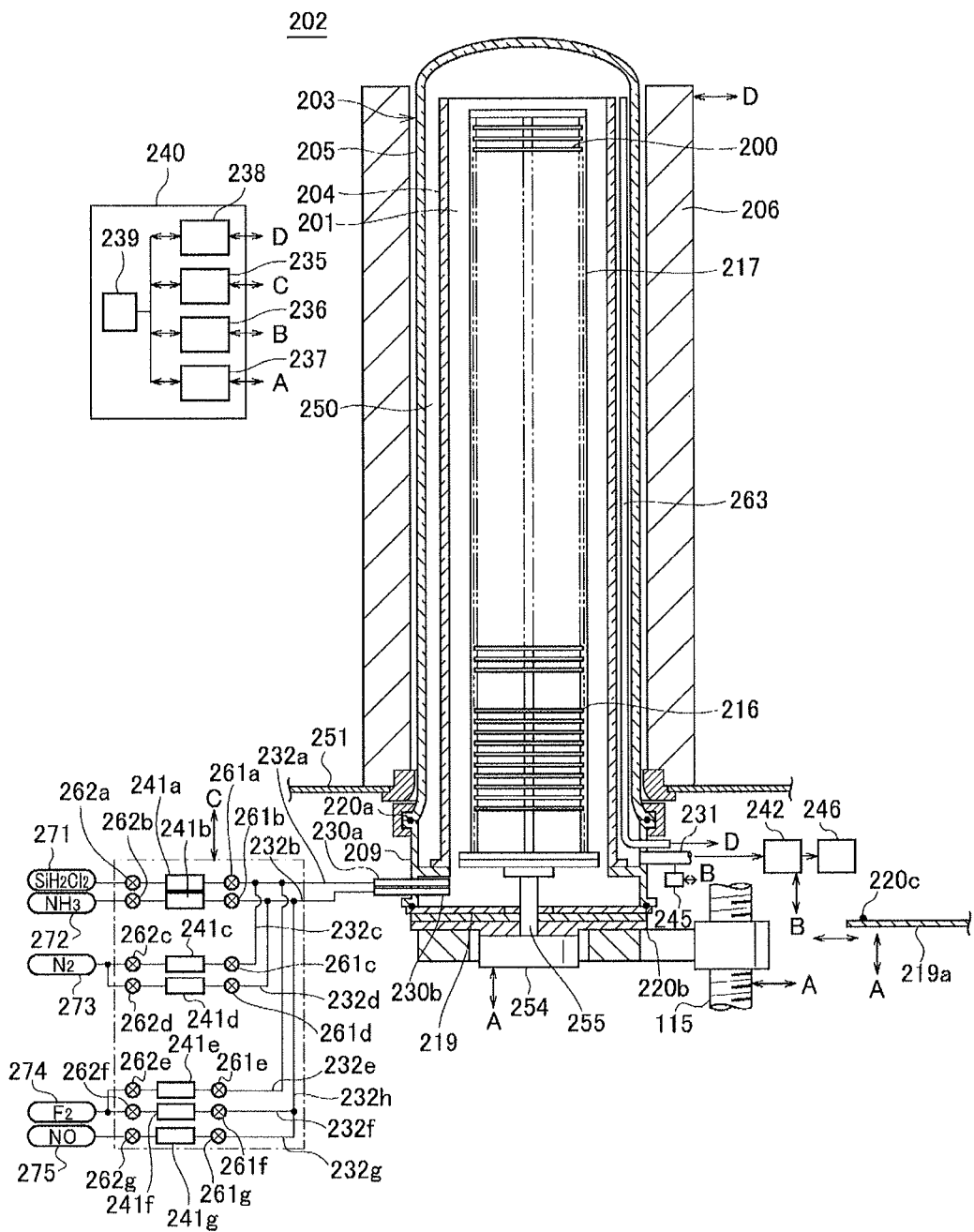

METHOD OF MANUFACTURING SEMICONDUCTOR DEVICE AND METHOD OF CLEANING PROCESSING VESSEL

CROSS-REFERENCE TO RELATED PATENT APPLICATION

This application is a continuation of U.S. patent application Ser. No. 13/089,988 filed Apr. 19, 2011, which claims priority from Japanese Patent Application No. 2010-099984 filed Apr. 23, 2010, all of which are incorporated by reference as if fully set forth.

1. Field of the Invention

The present invention relates to a substrate processing apparatus for processing a substrate, a method of manufacturing a semiconductor device including a process of processing a substrate and a method of cleaning a processing vessel.

2. Background

A thin-film forming process for forming a CVD thin film such as the silicon nitride film (a $Si_3N_4$ film) on a substrate such as a semiconductor wafer using a thermal chemical vapor deposition ("CVD") technique is one of processes of manufacturing a semiconductor device. The thin-film forming process using thermal CVD technique is performed by supplying a processing gas into a processing chamber having the substrate loaded therein. While the thin-film forming process is aimed at forming the thin film on a surface of the substrate, an undesirable deposit including the thin film is also adhered to regions other than the surface of the substrate, for example, to an inner wall of a reaction tube constituting the processing chamber. The deposit is accumulatively adhered each time the thin-film forming process is performed, and delaminated when the deposit reaches a predetermined thickness or more, thereby generating foreign matters (particles) in the processing chamber. Accordingly, whenever the deposit reaches the predetermined thickness, it is necessary to clean the inside of the processing chamber and members disposed in the processing chamber by removing the deposit.

The configuration of the typical CVD thin-film forming apparatus for a semiconductor will be described with reference to FIG. 1. The thin-film forming apparatus may include a reaction tube 103 including a film-forming chamber (a processing chamber 101) configured to process substrates 100, a boat 102 configured to hold the substrate 100 in the film-forming chamber 101 in multiple stages in a horizontal posture, a heating source 104 disposed around the reaction tube 103, a processing gas supply line 105 through which a processing gas for forming the CVD thin film is supplied into the film-forming chamber 101, a cleaning gas supply line 107a through which an $NF_3$ gas serving as a cleaning gas for removing a deposit via an etching process is supplied into the film-forming chamber 101, an additional gas supply line 107b through which an NO gas to be added to the cleaning gas is supplied, and an exhaust line 108 at which a pressure adjustment valve 106 for adjusting an inner pressure of the film-forming chamber 101 and a vacuum pump 109 are installed sequentially from an upstream side. The reaction tube 103 and the boat 102 are made of quartz ($SiO_2$).

Hereinafter, the thin-film forming process using the above-described thin-film forming apparatus will be described. First, the boat 102 holding the substrates 100 is loaded into the film-forming chamber 101. Thereafter, a surface of each of the substrates 100 is heated by the heating source 104 to a predetermined temperature. Afterwards, the processing gas is supplied through the processing gas supply line 105 into the film-forming chamber 101 while exhausting an inside of the film-forming chamber 101 through the exhaust line 108, and a thin film is then formed on the substrates 100 by a CVD reaction. A pressure of the film-forming chamber 101 is adjusted by the pressure adjustment valve 106 installed at the exhaust line 108 in order to maintain the pressure of the film-forming chamber 101 at a predetermined pressure. When the thin film having a predetermined thickness is formed on the substrates 100, the supply of the processing gas from the processing gas supply line 105 is stopped. Thereafter, the substrates 100 having the thin film formed thereon are cooled to a predetermined temperature, and the boat 102 is then unloaded from the film-forming chamber 101.

The above-described thin-film forming process is originally for forming the thin film on the substrate 100. However, when the thin film is formed on the substrate 100, a deposit including the thin film is actually adhered to surfaces of members such as an inner wall of the reaction tube 103 that constitutes the film-forming chamber 101 and the boat 102 each time the above-described thin-film forming process is performed. When the deposit reaches a predetermined thickness or more, the deposit is delaminated or dropped, thereby generating foreign matters on the substrate 100. Therefore, the deposit should be removed whenever the deposit reached the predetermined thickness.

Conventionally, a wet cleaning process including separating the reaction tube 103 from the substrate processing apparatus, dipping the reaction tube 103 in a cleaning solution including an HF solution, and removing the deposit by wet etching has been mainly adopted as a method for removing the deposit.

In recent years, however, a dry cleaning process wherein the reaction tube is not separated is increasingly used. The dry cleaning process includes directly supplying a gas (hereinafter, referred to as a "cleaning gas") containing fluorine (F) atoms and a dilution gas into a processing chamber and removing a silicon-based deposit such as a $Si_3N_4$ film by etching by controlling a temperature, a pressure, and a gas flow rate in the processing chamber. In addition, a technique of adding a gas containing oxygen (O) atoms to the cleaning gas is known as a means for improving the performance (i.e., etching rate) of the cleaning process (for example, refer to Japanese Patent Laid-Open Publication Nos. HEI 10-303186 and 2005-101583).

Furthermore, a technique using a FNO gas as the cleaning gas is also known (for example, Japanese Patent Laid-Open Publication No. 2003-44905.

A nitrogen monoxide (NO) gas is popular as the gas containing oxygen atoms to be added to the cleaning gas. However, when the NO gas is added to the cleaning gas, processing conditions such as a temperature and a pressure need to be adjusted to a high temperature and a high pressure or a cleaning rate is reduced. For example, when a nitrogen trifluoride ($NF_3$) gas is used as the cleaning gas, the processing chamber must be maintained under the condition of the high temperature and the high pressure in order to cause a sufficient reaction of the $NF_3$ gas with the NO gas due to a low reactivity of the $NF_3$ gas with the NO gas. Moreover, when a fluorine ($F_2$) gas is used as the cleaning gas, the $F_2$ gas excessively reacts with the NO gas due to a high reactivity of the $F_2$ gas with the NO gas, resulting in a degradation of the cleaning rate. That is, the addition of the NO gas to the cleaning gas results in a difficulty in handling and a degradation of a controllability of the cleaning performance.

In addition, when the FNO gas is used as the cleaning gas, the cleaning process is not performed in some cases. While the FNO gas added to the cleaning gas accelerates an etching reaction by the cleaning gas, using only the FNO gas does not facilitate an etching process due to a low etching rate. Furthermore, FNO is not commercialized as a gas presently, and an immediate adoption of the FNO gas as the cleaning gas is difficult. Furthermore, the above-described problems have been only discovered in latest research conducted by the inventors.

Hereinafter, the dry cleaning method will be briefly described. First, the empty boat 102 having the deposit adhered thereon is loaded into the reaction tube 103, namely, into the film-forming chamber 101 also having the deposit adhered thereon. Thereafter, the inside of the film-forming chamber 101 is heated by the heating source 104 to a predetermined temperature. Next, the $NF_3$ gas is supplied through the cleaning gas supply line 107a into the film-forming chamber 101 while exhausting the inside of the film-forming chamber 101 through the exhaust line 108, and the deposit adhered to the inside of the film-forming chamber 101, namely, the inner wall of the reaction tube 103 or the surface of the boat 102, is removed due to an etching reaction of active species generated by a decomposition of the cleaning gas with the deposit. Here, the NO gas is supplied from the additional gas supply line 107b and is added to the $NF_3$ gas supplied into the film-forming chamber 101 to improve the etching rate. Further, the pressure in the film-forming chamber 101 is adjusted by the pressure adjustment valve 106 installed at the exhaust line 108 in order to maintain the pressure of the film-forming chamber 101 at the predetermined pressure. When the deposit is removed from the film-forming chamber 101, the supply of the cleaning gas from the cleaning gas supply line 107 is stopped. Thereafter, a seasoning process is performed in the film-forming chamber 101. That is, the processing gas is supplied into the film-forming chamber 101 with the substrate 100 unloaded therefrom, and the thin film is formed (pre-coated) on the inner wall of the reaction tube 103 or the surface of the boat 102 in the film-forming chamber 101 so that the film-forming chamber 101 can be restored to a state in which the film forming process may be performed.

In addition to the $NF_3$ gas as the nitrogen fluoride gas, a $F_2$ gas may be used as the cleaning gas. However, as described above, when the $NF_3$ gas is used as the cleaning gas, the processing chamber must be maintained under the condition of the high temperature, for example 600° C. and the high pressure in order to cause the sufficient reaction of the $NF_3$ gas with the NO gas due to the low reactivity of the $NF_3$ gas with the NO gas. Moreover, when the $F_2$ gas is used as the cleaning gas, the $F_2$ gas excessively reacts with the NO gas due to a high reactivity of the $F_2$ gas with the NO gas, resulting in a degradation of the cleaning rate. That is, the addition of the NO gas to the cleaning gas results in the difficulty in handling and the degradation of the controllability of the cleaning performance.

In addition, a technique wherein only the FNO gas is used as the cleaning gas is also known. However, when only the FNO gas is used as the cleaning gas, the cleaning process is not performed in some cases according to the research by the inventors. While the FNO gas added to the cleaning gas accelerates the etching reaction by the cleaning gas, using only the FNO gas does not facilitate the etching process due to the low etching rate. Furthermore, FNO is not commercialized as the gas presently, and the immediate adoption of the FNO gas as the cleaning gas is difficult.

SUMMARY OF THE INVENTION

It is an object of the present invention to provide a substrate processing apparatus, a method of manufacturing a semiconductor device and a method of cleaning a processing vessel which facilitates the handling of the cleaning gas and improve the controllability of the cleaning performance when the dry cleaning process is performed in the processing chamber by adding the NO gas to the cleaning gas.

According to one embodiment of the present invention, there is provided a substrate processing apparatus including: a processing vessel configured to process a substrate; a processing gas supply system configured to supply a processing gas into the processing vessel; a first cleaning gas supply system configured to supply a pre-mixed gas including a fluorine-containing gas and a nitrogen monoxide gas into the processing vessel; a second cleaning gas supply system installed apart from the first cleaning gas supply system and configured to supply the fluorine-containing gas into the processing vessel; and a controller configured to control the processing gas supply system, the first cleaning gas supply system, and the second cleaning gas supply system in a manner that the processing gas is supplied into the processing vessel accommodating the substrate to form a thin film on the substrate, and that the pre-mixed gas and the fluorine-containing gas is supplied into the processing vessel through the first cleaning gas supply system and the second cleaning gas supply system respectively so as to remove a deposit containing the thin film adhered to an inside of the processing vessel.

According to another embodiment of the present invention, there is provided a substrate processing apparatus including: a processing vessel configured to process a substrate; a processing gas supply system configured to supply a processing gas into the processing vessel; a first cleaning gas supply system comprising a preliminary decomposition chamber for decomposing a fluorine-containing gas, the first cleaning gas supply system configured to supply a pre-mixed gas including a gas obtained from decomposing the fluorine-containing gas in the preliminary decomposition chamber and a nitrogen monoxide gas into the processing vessel; a second cleaning gas supply system installed apart from the first cleaning gas supply system and configured to supply the fluorine-containing gas into the processing vessel; and a controller configured to control the processing gas supply system, the first cleaning gas supply system, and the second cleaning gas supply system in a manner that the processing gas is supplied into the processing vessel accommodating the substrate to form a thin film on the substrate, and that the pre-mixed gas and the fluorine-containing gas is supplied into the processing vessel through the first cleaning gas supply system and the second cleaning gas supply system respectively so as to remove a deposit containing the thin film adhered to an inside of the processing vessel.

According to still another embodiment of the present invention, there is provided a method of manufacturing a semiconductor device, including: supplying a processing gas into a processing vessel accommodating a substrate to form a thin film on the substrate; and supplying a pre-mixed gas including a fluorine-containing gas and a nitrogen monoxide gas into the processing vessel through a first cleaning gas supply system while simultaneously supplying the fluorine-containing gas into the processing vessel through a second cleaning gas supply system installed apart from the first cleaning gas supply system so as to remove a deposit containing the thin film adhered to an inside of the processing vessel.

According to yet another embodiment of the present invention, there is provided a method of manufacturing a semiconductor device, including: supplying a processing gas into a processing vessel accommodating a substrate to form a thin film on the substrate; and supplying a pre-mixed gas including a gas obtained from decomposing a fluorine-containing gas in a preliminary decomposition chamber and a nitrogen monoxide gas into the processing vessel through a first cleaning gas supply system while simultaneously supplying the fluorine-containing gas into the processing vessel through a second cleaning gas supply system installed apart from the first cleaning gas supply system so as to remove a deposit containing the thin film adhered to an inside of the processing vessel.

According to yet another embodiment of the present invention, there is provided a method of cleaning an inside of a processing vessel including: providing the processing vessel configured to process a substrate to form a thin film thereon; and supplying a pre-mixed gas including a fluorine-containing gas and a nitrogen monoxide gas into the processing vessel through a first cleaning gas supply system while simultaneously supplying the fluorine-containing gas into the processing vessel through a second cleaning gas supply system installed apart from the first cleaning gas supply system so as to remove a deposit containing the thin film adhered to the inside of the processing vessel.

According to yet another embodiment of the present invention, there is provided a method of cleaning an inside of a processing vessel including: providing the processing vessel configured to process a substrate to form a thin film thereon; and supplying a pre-mixed gas including a gas obtained from decomposing a fluorine-containing gas in a preliminary decomposition chamber and a nitrogen monoxide gas into the processing vessel through a first cleaning gas supply system while simultaneously supplying the fluorine-containing gas into the processing vessel through a second cleaning gas supply system installed apart from the first cleaning gas supply system so as to remove a deposit containing the thin film adhered to the inside of the processing vessel.

According to a substrate processing apparatus, a method of manufacturing a semiconductor device and a method of cleaning a processing vessel of the present invention, when the dry cleaning process is performed in the processing chamber by adding the nitrogen monoxide (NO) gas to the cleaning gas, the handling is facilitated, and the controllability of the cleaning performance is improved.

BRIEF DESCRIPTION OF THE DRAWINGS

FIG. 3 is a configuration diagram schematically illustrating a processing furnace of a substrate processing apparatus according to another embodiment of the present invention.

DETAILED DESCRIPTION OF THE PREFERRED EMBODIMENTS

As described above, a CVD thin film is formed by supplying a processing gas into a processing chamber having a substrate loaded therein. Hereinafter, a configuration of a typical thin-film forming apparatus and a typical thin-film forming process will be briefly described.

Therefore, the inventors have conducted assiduous research on a method for performing a dry cleaning process in a processing chamber which facilitates the handling of the cleaning gas and improve the controllability of the cleaning performance. As a result, the inventors came to a conclusion that the above-described problems can be solved by adding the FNO to a gas containing F atoms. That is, the inventors are of an opinion that the above-described problems can be solved by causing a state where the fluorine-containing gas and the FNO gas exist together since the FNO gas serves to accelerate an etching reaction by the fluorine-containing gas. The present invention is based on the inventors' findings.

Hereinafter, one embodiment of the present invention will be described.

(1) Configuration of Substrate Processing Apparatus

Figure 1:
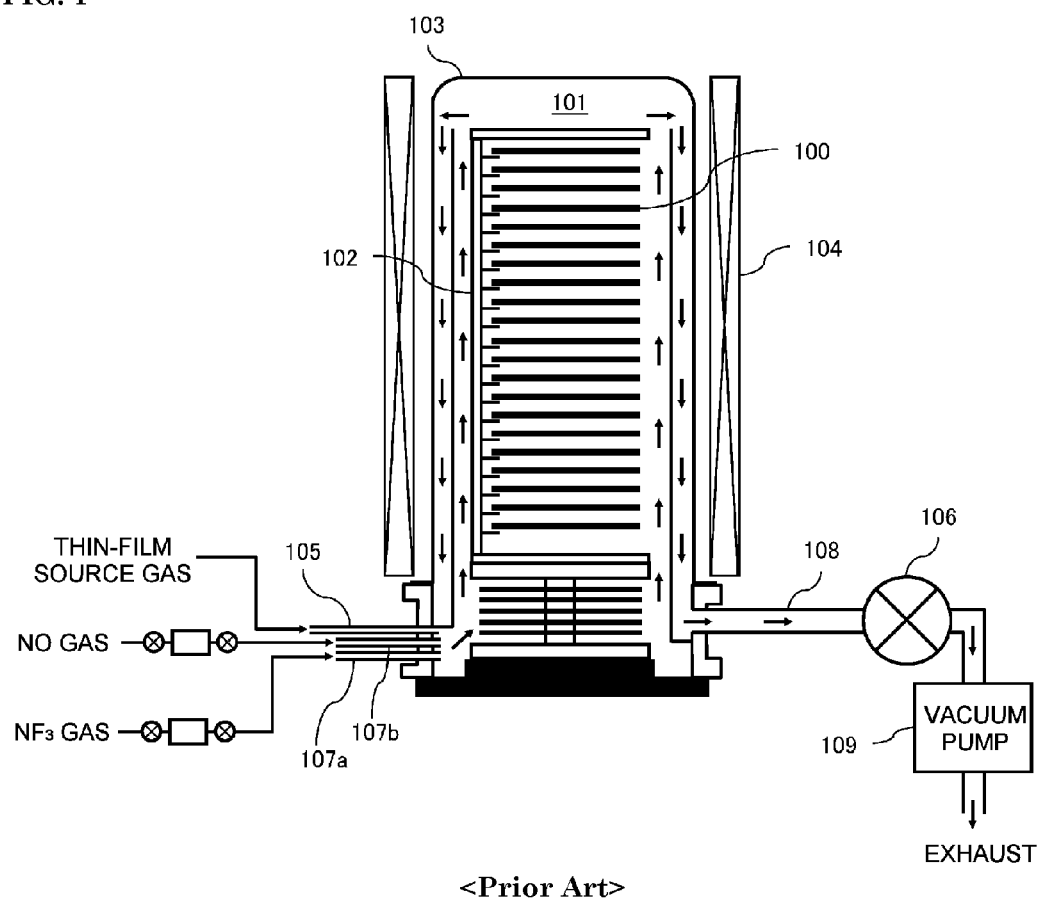
FIG. 1 is a configuration diagram schematically illustrating a typical chemical-vapor-deposition (CVD) thin-film forming apparatus for a semiconductor.
Figure 2:
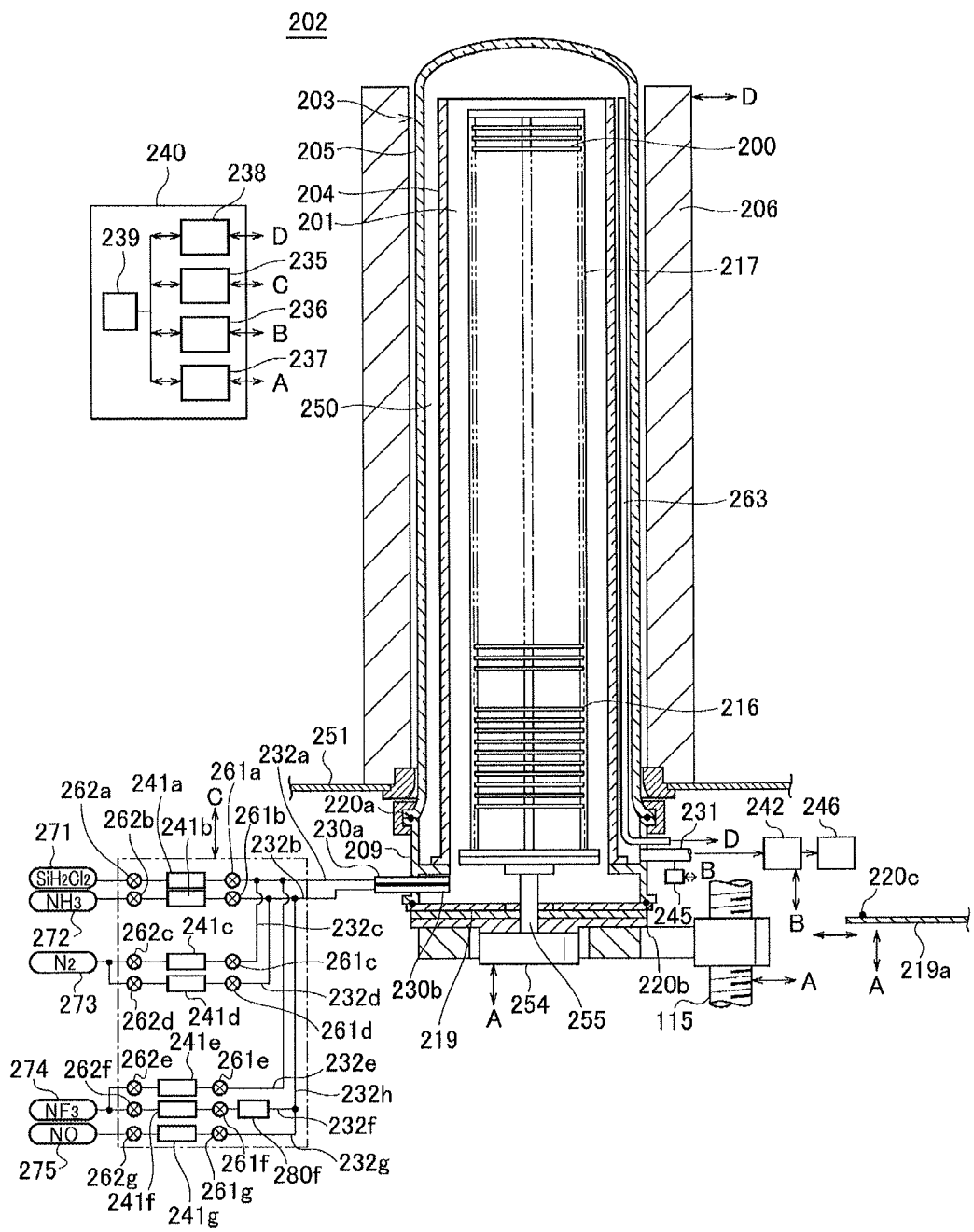
FIG. 2 is a configuration diagram schematically illustrating a processing furnace of a substrate processing apparatus according to one embodiment of the present invention.

First, the configuration of the substrate processing apparatus according to the embodiment of the present invention will be described with reference to the accompanying drawings. FIG. 2 is a configuration diagram schematically illustrating a processing furnace 202 of the substrate processing apparatus according to one embodiment, which is depicted in a longitudinal sectional view.

As shown in FIG. 2, the processing furnace 202 may include a heater 206 serving as a heating mechanism. The heater 206 has a cylindrical shape and is supported by a heater base 251 serving as a holding plate and vertically installed.

A process tube 203 serving as a reaction tube is installed inside the heater 206. The process tube 203 is concentric with the heater 206. The process tube 203 includes an inner tube 204 serving as an internal reaction tube and an outer tube 205 serving as an external reaction tube installed outside the inner tube 204. The inner tube 204 is made of a heat-resistant material, such as quartz ($SiO_2$) or silicon carbide (SiC), and has a cylindrical shape with open upper and lower ends. A processing chamber 201 wherein a process of forming a thin film on a wafer 200 serving as a substrate is performed is formed in a cylindrical hollow portion of the inner tube 204. The processing chamber 201 is capable of accommodating the wafers 200 in a horizontal posture aligned in multiple stages in a vertical direction by means of a boat 217 which is described later. The outer tube 205 is made of the heat-resistant material, for example, quartz or silicon carbide and has an inner diameter greater than an outer diameter of the inner tube 204. The outer tube 205 has a cylindrical shape with a closed upper end and an open lower end and is concentric with the inner tube 204.

A manifold 209 concentric with the outer tube 205 is installed below the outer tube 205. The manifold 209 is made of, for example, a stainless steel or the like and has a cylindrical shape with open upper and lower ends. The manifold 209 is engaged with the inner tube 204 and the outer tube 205 and installed to support the inner tube 204 and the outer tube 205. Also, an O-ring 220*a* serving as a sealing member is installed between the manifold 209 and the outer tube 205. By supporting the manifold 209 by the heater base 251, the process tube 203 is vertically installed. The process tube 203 and the manifold 209 constitute a reaction vessel serving as a processing vessel.

Nozzles 230*a* and 230*b* serving as gas introduction members are connected to the manifold 209 such that the nozzles 230*a* and 230*b* communicate with the inside of the processing chamber 201. Processing gas supply pipes 232a and 232b through which a processing gas for forming a thin film is supplied into the processing chamber 201 are connected to the nozzles 230a and 230b, respectively. A SiH$_2$Cl$_2$ (dichlorosilane or DCS) gas supply source 271 serving as a first processing gas supply source is connected to an upstream side of the processing gas supply pipe 232a, which is disposed opposite to a connection portion between the processing gas supply pipe 232a and the nozzle 230a, via a mass-flow controller (MFC) 241a serving as a gas flow rate controller. Valves 262a and 261a are respectively installed at upstream and downstream sides of the MFC 241a in the processing gas supply pipe 232a. An NH$_3$ gas supply source 272 serving as a second processing gas supply source is connected to an upstream side of the processing gas supply pipe 232b, which is disposed opposite to a connection portion between the processing gas supply pipe 232b and the nozzle 230b, via an MFC 241b serving as the gas flow rate controller. Valves 262b and 261b are installed at upstream and downstream sides of the MFC 241b in the processing gas supply pipe 232b. Mainly, the processing gas supply system is constituted by the processing gas supply pipes 232a and 232b, the MFCs 241a and 241b, the valves 262a, 261a, 262b, and 261b, the SiH$_2$Cl$_2$ gas supply source 271, and the NH$_3$ gas supply source 272.

Inert gas supply pipes 232c and 232d are respectively connected to downstream sides of the valves 261a and 261b in the processing gas supply pipes 232a and 232b. An N$_2$ gas supply source 273 serving as an inert gas supply source is connected to an upstream side of the inert gas supply pipe 232c, which is disposed opposite to a connection portion between the inert gas supply pipe 232c and the processing gas supply pipe 232a, via an MFC 241c serving as the gas flow rate controller. Valves 262c and 261c are respectively installed at upstream and downstream sides of the MFC 241c in the inert gas supply pipe 232c. The N$_2$ gas supply source 273 is connected to an upstream side of the inert gas supply pipe 232d, which is disposed opposite to a connection portion between the inert gas supply pipe 232d and the processing gas supply pipe 232b, via an MFC 241d serving as the gas flow rate controller. Specifically, the upstream side of the inert gas supply pipe 232d is connected to an upstream side of the valve 262c in the inert gas supply pipe 232d, while the upstream side of the valve 262c of the inert gas supply pipe 232d is branched from the inert gas supply pipe 232c. Valves 262d and 261d are respectively installed at upstream and downstream sides of the MFC 241d in the inert gas supply pipes 232d. Mainly, the inert gas supply system is constituted by the inert gas supply pipes 232c and 232d, the MFCs 241c and 241d, the valves 262c, 261c, 262d, and 261d, and the N$_2$ gas supply source 273. Also, the inert gas supply system functions to dilute the processing gas or the cleaning gas and constitutes a portion of the processing gas supply system or a cleaning gas supply system. In addition, the inert gas supply system also functions as a purge gas supply system.

A downstream end of a first cleaning gas supply pipe 232h through which a pre-mixed gas including a gas obtained from decomposing a gas containing fluorine atoms and a nitrogen monoxide (NO) gas is supplied into the processing chamber 201 is connected to a downstream side of a connection portion between the processing gas supply pipe 232b and the inert gas supply pipe 232d as the downstream side of the valve 261b in the processing gas supply pipe 232b. Each of a downstream end of an the NF$_3$ gas supply pipe 232f through which the NF$_3$ gas is supplied and a downstream end of an the NO gas supply pipe 232g through which the NO gas is supplied is connected to an upstream side of the first cleaning gas supply pipe 232h, which is disposed opposite to a connection portion between the first cleaning gas supply pipe 232h and the processing gas supply pipe 232b. The NF$_3$ gas supply source 274, a valve 262f, an MFC 241f serving as the gas flow rate controller, a valve 261f, and a preliminary decomposition chamber 280f configured to decompose the NF$_3$ gas are installed sequentially from an upstream side of the NF$_3$ gas supply pipe 232f. The NO gas supply source 275, a valve 262g, an MFC 241g serving as the gas flow rate controller and a valve 261g are installed sequentially from an upstream side of the NO gas supply pipe 232g. The preliminary decomposition chamber 280f decomposes the NF$_3$ gas serving as the gas containing F atoms using plasma or heat and generates the F$_2$ gas. For example, a plasma source or a heater may be employed as a decomposition source for decomposing the NF$_3$ gas. Mainly, the first cleaning gas supply system is constituted by the first cleaning gas supply pipe 232h, the NF$_3$ gas supply pipe 232f, the NO gas supply pipe 232g, the MFCs 241f and 241g, the valves 262f, 261f, 262g, and 261g, the preliminary decomposition chamber 280f, the NF$_3$ gas supply source 274, and the NO gas supply source 275.

By opening the valves 262f and 261f, the NF$_3$ gas supplied from the NF$_3$ gas supply source 274 is adjusted in terms of flow rate by the MFC 241f, supplied into the preliminary decomposition chamber 280f, and decomposed into the F$_2$ gas and an N$_2$ gas. The F$_2$ gas generated in the preliminary decomposition chamber 280f is supplied into the first cleaning gas supply pipe 232h via the NF$_3$ gas supply pipe 232f. By further opening the valves 262g and 261g, the NO gas supplied from the gas supply source 275 is adjusted in terms of flow rate by the MFC 241g and supplied into the first cleaning gas supply pipe 232h via the NO gas supply pipe 232g. Thereafter, the F$_2$ gas is mixed with the NO gas in the first cleaning gas supply pipe 232h to generate the FNO. A gas containing the generated FNO is supplied into the processing chamber 201 via the first cleaning gas supply pipe 232h, the processing gas supply pipe 232b, and the nozzle 230b. Accordingly, in accordance with the present embodiment, the F$_2$ gas generated by the preliminary decomposition and the NO gas are mixed in advance (premixed) with each other in the first cleaning gas supply pipe 232h before being supplied into the processing chamber 201 instead of separately supplying each of the F$_2$ gas and the NO gas into the processing chamber 201. Thus, the generation efficiency of the FNO can be improved. On the other hand, when the F$_2$ gas and the NO gas are separately supplied into the processing chamber 201, a reaction of the F$_2$ gas with the NO gas insufficiently occurs, thereby reducing the generation efficiency of the FNO.

In addition, by elongating a flow path [the first cleaning gas supply pipe 232h and a downstream side of a connection portion between the first cleaning gas supply pipe 232h and the processing gas supply pipe 232b through which the F$_2$ gas generated by the preliminary decomposition and the NO gas meet each other and flow into the processing chamber 201, reactivity between the F$_2$ gas and the NO gas can be further increased, and the generation efficiency of the FNO can be further improved. In other words, when a mixture of the F$_2$ gas generated by the preliminary decomposition and the NO gas is supplied into the processing chamber 201 in an extremely short time after the F$_2$ gas is mixed with the NO gas, a reaction of the F$_2$ gas with the NO gas insufficiently occurs in some cases. However, by adjusting the flow path described above, the F$_2$ gas may sufficiently react with the NO gas.

A downstream end of a second cleaning gas supply pipe 232e through which the $NF_3$ gas serving as the gas containing F atoms is supplied into the processing chamber 201 is connected to a downstream side of a connection portion between the processing gas supply pipe 232a and the inert gas supply pipe 232c as the downstream side of the valve 261a in the processing gas supply pipe 232a. An upstream end of the second cleaning gas supply pipe 232e is connected to an upstream side of the valve 262f in the $NF_3$ gas supply pipe 232f. A valve 262e, an MFC 241e serving as the gas flow rate controller, and a valve 261e are installed sequentially from the upstream side of the second cleaning gas supply pipe 232e. Mainly, a second cleaning gas supply system is constituted by the $NF_3$ gas supply pipe 232f, the second cleaning gas supply pipe 232e, the MFC 241e, the valves 262e and 261e, and the $NF_3$ gas supply source 274.

By opening the valves 262e and 261e, the $NF_3$ gas supplied from the $NF_3$ gas supply source 274 is adjusted in terms of flow rate by the MFC 241e and supplied into the processing chamber 201 via the second cleaning gas supply pipe 232e, the processing gas supply pipe 232a, and the nozzle 230a. Thus, in accordance with the embodiment, the second cleaning gas supply system is installed apart from the first cleaning gas supply system. Also, the gas containing FNO supplied from the first cleaning gas supply system and the fluorine-containing gas supplied from the second cleaning gas supply system are separately supplied into the processing chamber 201 and mixed for the first time (post-mixed) in the processing chamber 201.

A gas supply/flow rate controller 235 is electrically connected to the MFCs 241a, 241b, 241c, 241d, 241e, 241f, and 241g, the valves 261a, 261b, 261c, 261d, 261e, 261f, 261g, 262a, 262b, 262c, 262d, 262e, 262f, and 262g and the preliminary decomposition chamber 280f. The gas supply/flow rate controller 235 is configured to control the MFCs 241a, 241b, 241c, 241d, 241e, 241f, and 241g and the valves 261a, 261b, 261c, 261d, 261e, 261f, 261g, 262a, 262b, 262c, 262d, 262e, 262f, and 262g at desired time points such that desired types of gases are supplied at desired flow rates and desired concentrations into the processing chamber 201 in each of steps described later. In addition, the gas supply/flow rate controller 235 is configured to control operations of the decomposition source of the preliminary decomposition chamber 280f such as the plasma source or the heater.

An exhaust pipe 231 configured to exhaust an atmosphere from the processing chamber 201 is installed at the manifold 209. The exhaust pipe 231 is disposed at a lower end portion of a cylindrical space 250 defined by a gap between the inner tube 204 and the outer tube 205 and communicates with the cylindrical space 250. A vacuum exhaust device 246, such as a vacuum pump, is connected to a downstream side of the exhaust pipe 231, which is disposed opposite to a connection portion between the exhaust pipe 231 and the manifold 209, via a pressure sensor 245 serving as a pressure detector and a variable conductance valve, for example, a pressure adjustment device 242 such as an auto-pressure controller (APC) valve. The vacuum exhaust device 246 is configured to vacuum-exhaust the inside of the processing chamber 201 such that a pressure in the processing chamber 201 reaches a predetermined pressure (degree of vacuum). A pressure controller 236 is electrically connected to the pressure adjustment device 242 and the pressure sensor 245. The pressure controller 236 is controls the pressure adjustment device 242 at a desired time point based on a pressure detected by the pressure sensor 245 so that the pressure in the processing chamber 201 maintains a desired pressure.

Mainly, the exhaust system is constituted by the exhaust pipe 231, the pressure adjustment device 242, and the vacuum device 246.

A seal cap 219 is installed under the manifold 209 and serves as a first furnace-opening cover body capable of closing a lower end opening of the manifold 209 in an air tight manner. The seal cap 219 is configured to abut with a lower end of the manifold 209 upward in a vertical direction. The seal cap 219 is made of a metal, such as stainless steel, and has a disk shape. An O-ring 220b serving as the sealing member abutting with the lower end of the manifold 209 is installed on a top surface of the seal cap 219. A rotation mechanism 254 configured to rotate the boat is installed at a side of the seal cap 219 opposite to the processing chamber 201. A rotation axis 255 of the rotation mechanism 254 is connected to the boat 217 to be described later through the seal cap 219 and configured to rotate the wafer 200 by rotating the boat 217. The seal cap 219 is configured to move up and down in a vertical direction by means of a boat elevator 115 serving as an elevating mechanism installed vertically outside the process tube 203 such that the boat 217 may be loaded into or unloaded from the processing chamber 201. A driving controller 237 is electrically connected to the rotation mechanism 254 and the boat elevator 115. The driving controller 237 is configured to control the rotation mechanism 254 and the boat elevator 115 at desired time points such that the rotation mechanism 254 and the boat elevator 115 perform desired operations. In addition, a shutter 219a is installed under the manifold 209 and serves as a second furnace-opening cover body capable of closing the lower end opening of the manifold 209 in the air tight manner. The shutter 219a is configured to be lifted/lowered and rotated. The shutter 219a is configured to abut with the lower end of the manifold 209 after the boat 217 is unloaded from the processing chamber 201, and to close the inside of the processing chamber 201 having the boat 217 unloaded in the air tight manner. An O-ring 220c serving as the sealing member abutting with the lower end of the manifold 209 is installed on a top surface of the shutter 219a.

The boat 217 serving as a substrate holder is made of the heat-resistant material, such as quartz or silicon carbide, and is configured to align centers of a plurality of wafers 200 with one another and hold the plurality of wafers 200 in multiple stages in a horizontal posture. Further, a plurality of insulation plates 216 serving as disk-shaped insulation members are made of the heat-resistant material, such as quartz or silicon carbide, disposed in a lower portion of the boat 217 in multiple stages in a horizontal posture and configured to preclude transmission of heat from the heater 206 from reaching the side of the manifold 209.

A temperature sensor 263 serving as a temperature detector is installed in the process tube 203. A temperature controller 238 is electrically connected to the heater 206 and the temperature sensor 263. The temperature controller 238 controls a conduction state to the heater 206 at desired time points based on temperature information detected by the temperature sensor 263 such that the inside of the processing chamber 201 has a desired temperature distribution.

The gas supply/flow rate controller 235, the pressure controller 236, the driving controller 237, and the temperature controller 238 also constitute a manipulation unit and an input/output (I/O) unit and are electrically connected to a main controller 239 configured to control the entire substrate processing apparatus. The gas supply/flow rate controller 235, the pressure controller 236, the driving controller 237, the temperature controller 238, and the main controller 239 constitute a controller 240.

(2) Thin-Film Forming Process

Hereinafter, as one process of a processes for manufacturing a semiconductor device, a process of forming a thin film on the wafer 200 in the processing chamber 201 using a CVD technique by means of the processing furnace 202 having the above-described configuration will be described. Further, in the following description, the operation of each component constituting the substrate processing apparatus is controlled by the controller 240.

When the plurality of wafers 200 are charged in the boat 217 (wafer charging), as shown in FIG. 2, the boat 217 holding the plurality of wafers 200 is lifted by the boat elevator 115 and loaded into the processing chamber 201 (boat loading). The lower end of the manifold 209 is sealed by the seal cap 219 via the O-ring 220b.

The processing chamber 201 is vacuum-exhausted by the vacuum exhaust device 246 such that the inner pressure thereof is lowered to a desired pressure (degree of vacuum). Here, the inner pressure of the processing chamber 201 is measured by the pressure sensor 245, and the pressure adjustment device 242 is feedback-controlled based on the measured pressure information. In addition, the processing chamber 201 is heated by the heater 206, such that the temperature therein reaches a desired temperature. Here, a conduction state to the heater 206 is feedback-controlled based on temperature information detected by the temperature sensor 263 such that the inside of the processing chamber 201 has the desired temperature distribution. Subsequently, the boat 217 is rotated by the rotation mechanism 254, thereby rotating the wafer 200.

Next, $SiH_2Cl_2$ gas serving as a first processing gas and $NH_3$ gas serving as a second processing gas are respectively supplied from the $SiH_2Cl_2$ gas supply source 271 serving as the first processing gas supply source and the $NH_3$ gas supply source 272 serving as the second processing gas supply source into the processing chamber 201 with the inside of the processing chamber 201 being at the desired temperature under the desired pressure. That is, by opening the valves 262a, 261a, 262b, and 261b, the $SiH_2Cl_2$ gas and the $NH_3$ gas supplied from the $SiH_2Cl_2$ gas supply source 271 and the $NH_3$ gas supply source 272 into the processing gas supply pipes 232a and 232b, respectively, are controlled to have desired flow rates by the MFCs 241a and 241b, respectively, and are introduced from the nozzles 230a and 230b through the processing gas supply pipes 232a and 232b, respectively, into the processing chamber 201.

Simultaneously, the $N_2$ gas may be supplied from the $N_2$ gas supply source 273 serving as the inert gas supply source into the processing chamber 201 and the processing gases (the $SiH_2Cl_2$ gas and the $NH_3$ gas) may be diluted with the $N_2$ gas. In this case, for example, by opening the valves 262c, 261c, 262d, and 261d, the $N_2$ gas supplied from the $N_2$ gas supply source 273 into each of the inert gas supply pipes 232c and 232d is controlled to have a desired flow rate by each of the MFCs 241c and 241d, passes through each of the inert gas supply pipes 232c and 232d, and is introduced from each of the nozzles 230a and 230b via each of the processing gas supply pipes 232a and 232b into the processing chamber 201. The $N_2$ gas is mixed with the $SiH_2Cl_2$ gas and the $NH_3$ gas in the processing gas supply pipes 232a and 232b, respectively. The concentration of the processing gas may be controlled by controlling the flow rate of the supplied $N_2$ gas.

The processing gas introduced into the processing chamber 201 goes up inside the processing chamber 201, flows out from an upper end opening of the inner tube 204 into the cylindrical space 250, flows down in the cylindrical space 250, and is exhausted through the exhaust pipe 231. While passing through the processing chamber 201, the processing gas contacts the surface of the wafer 200. The thin film, that is, a silicon nitride ($Si_3N_4$) film, is deposited on the surface of the wafer 200 by a thermal CVD reaction.

After a predetermined processing time has elapsed, the supply of the processing gas is stopped. That is, by closing the valves 262a, 261a, 262b, and 261b, the supply of the $SiH_2Cl_2$ gas and the $NH_3$ gas from the $SiH_2Cl_2$ gas supply source 271 and the $NH_3$ gas supply source 272 into the processing chamber 201 is stopped. Thereafter, by opening the valves 262c, 261c, 262d, and 261d, the $N_2$ gas is supplied from the $N_2$ gas supply source 273 into the processing chamber 201 and is exhausted through the exhaust pipe 231 to purge the inside of the processing chamber 201. in addition, an inner atmosphere of the processing chamber 201 is replaced by the $N_2$ gas so that an inner pressure of the processing chamber 201 returns to atmospheric pressure.

Thereafter, the seal cap 219 is lowered by the boat elevator 115 to open a lower end of the manifold 209 and simultaneously, the processed wafer 200 is unloaded (boat unloading) from the lower end of the manifold 209 out of the process tube 203 with the processed wafer 200 held by the boat 217. Afterwards, the processed wafer 200 is discharged from the boat 217 (wafer discharging).

Meanwhile, processing conditions when processing the wafers 200 in the processing furnace 202 of the present embodiment, for example, in formation of the silicon nitride film, are as follows:

Processing temperature: 650 to 800° C.,
Processing pressure: 10 to 500 Pa,
Supply flow rate of the $SiH_2Cl_2$ gas: 100 to 500 sccm,
Supply flow rate of the $NH_3$ gas: 500 to 5,000 sccm.

The processing of the wafer 200 is performed by maintaining the respective processing conditions constant within the respective ranges.

(3) Cleaning Process

Hereinafter, a method for cleaning the inside of the processing chamber 201 will be described. In addition, in the following description, operations of respective components of the substrate processing apparatus are controlled by the controller 240.

By repeating the above-described thin-film forming process, the thin film, such as the silicon nitride film, is accumulated inside the processing chamber including the inner wall of the process tube 203. That is, the deposit including the thin film is adhered to the inner wall of the process tube 203. The cleaning process is performed in the processing chamber 201 at a time point when the deposit (accumulated thin film) adhered to the inner wall of the process tube 203 reaches the predetermined thickness before the deposit delaminates or drops. The cleaning process includes supplying, from the first cleaning gas supply system into the processing chamber 201a, a pre-mixed gas obtained by pre-mixing a gas obtained from decomposing the $NF_3$ gas in the preliminary decomposition chamber 280f with the NO gas, and exhausting the pre-mixed gas from the processing chamber 201, while simultaneously supplying the $NF_3$ gas from the second cleaning gas system installed apart from the first cleaning gas supply system and exhausting the $NF_3$ gas, with the processed wafer 200 discharged from the processing chamber 201, to remove the deposit adhered to the processing chamber 201.

Hereinafter, the cleaning process will be described in detail.

The empty boat 217 in which the wafer 200 is not charged is lifted by the boat elevator 115 and loaded (boat loading) into the processing chamber 201. The seal cap 219 is in a state of sealing a lower end of the manifold 209 via the O-ring 220b.

The processing chamber 201 is vacuum-exhausted by the vacuum exhaust device 246 such that the inner pressure thereof is lowered to a desired pressure (degree of vacuum). Here, the inner pressure of the processing chamber 201 is measured by the pressure sensor 245, and the pressure adjustment device 242 is feedback-controlled based on the measured pressure information. In addition, the processing chamber 201 is heated by the heater 206, such that the temperature therein reaches a desired temperature. Here, a conduction state to the heater 206 is feedback-controlled based on temperature information detected by the temperature sensor 263 such that the inside of the processing chamber 201 has the desired temperature distribution. When the inner pressure and the temperature of the processing chamber 201 reach the predetermined pressure and the predetermined temperature, respectively, control is performed to maintain the predetermined pressure and the predetermined temperature. Subsequently, the boat 217 is rotated by the rotation mechanism 254. However, the boat 217 may not be rotated.

Thereafter, while maintaining the inner temperature and pressure of the processing chamber 201 at the predetermined temperature and the predetermined pressure, the pre-mixed gas including the gas obtained by decomposing the $NF_3$ gas in the preliminary decomposition chamber 280f and the NO gas is supplied into the processing chamber 201 from the first cleaning gas supply system, and the pre-mixed gas is exhausted from the processing chamber 201, and the $NF_3$ gas is simultaneously supplied from the second cleaning gas supply system installed apart from the first cleaning gas supply system and the $NF_3$ is exhausted to clean the processing chamber 201.

Specifically, by opening the valves 262f and 261f, the $NF_3$ gas supplied from the $NF_3$ gas supply source 274 is adjusted in terms of flow rate by the MFC 241f. The $NF_3$ gas is then supplied into the preliminary decomposition chamber 280f via the $NF_3$ gas supply pipe 232f and decomposed into $F_2$ gas and $N_2$ gas, and supplied into the first cleaning gas supply pipe 232h. In this case, by further opening the valves 262g and 261g, the NO gas supplied from the NO gas supply source 275 is adjusted in terms of flow rate by the MFC 241g and supplied into the first cleaning gas supply pipe 232h via the NO gas supply pipe 232g. Thereafter, FNO is generated by pre-mixing the $F_2$ gas with the NO gas in the first cleaning gas supply pipe 232h, and a gas containing the FNO is supplied into the processing chamber 201 via the first cleaning gas supply pipe 232h, the processing gas supply pipe 232b, and the nozzle 230b. The $F_2$ gas generated by the preliminary decomposition and the NO gas are mixed in advance (pre-mixed) with each other in the first cleaning gas supply pipe 232h before being supplied into the processing chamber 201 instead of separately supplying each of the $F_2$ gas and the NO gas into the processing chamber 201, thereby improving a generation efficiency of the FNO.

By opening the valves 262e and 261e simultaneously with the initiation of the supply of the gas containing the FNO into the processing chamber 201, the $NF_3$ gas supplied from the $NF_3$ gas supply source 274 is adjusted in terms of flow rate by the MFC 241e and supplied into the processing chamber 201 via the second cleaning gas supply pipe 232e, the processing gas supply pipe 232a, and the nozzle 230a.

In addition, when a rate of the decomposition of the $NF_3$ gas in the preliminary decomposition chamber 280f is 100%, the $NF_3$ gas is decomposed according to a reaction formula $2NF_3 \rightarrow 3F_2 + N_2$. Assuming that the $NF_3$ gas is supplied at a flow rate of 1 slm into the preliminary decomposition chamber 280f, a decomposed gas (a mixture gas of the $F_2$ gas and the $N_2$ gas) containing 75% of $F_2$ and 25% of $N_2$ is supplied at a flow rate of 2 slm into the first cleaning gas supply pipe 232h. In this case, assuming that the NO gas is supplied at a flow rate of 2 slm into the first cleaning gas supply pipe 232h, the FNO is generated in the first cleaning gas supply pipe 232h according to a reaction formula: $F_2 + 2NO \rightarrow 2FNO$ and supplied at a flow rate of 2 slm into the processing chamber 201. In this case, the flow rate of the $NF_3$ gas supplied into the processing chamber 201 via the second cleaning gas supply pipe 232e is, for example, 2 slm.

The gas containing FNO and the $NF_3$ gas introduced into the processing chamber 201 are mixed in the processing chamber 201, flow upward in the processing chamber 201, flow out through an upper end opening of the inner tube 204 into the cylindrical space 250, flow downward in the cylindrical space 250, and are exhausted through the exhaust pipe 231. While passing through the processing chamber 201, the $NF_3$ gas contacts the deposit including the thin film, such as the silicon nitride film, which is accumulated on the inner wall of the process tube 203 or a surface of the boat 217 to remove the thin film by a thermal chemical reaction. In addition, the FNO serves to accelerate the etching reaction by the $NF_3$ gas. Accordingly, the FNO-containing gas is mixed with the $NF_3$ gas in the processing chamber 201 to cause a state where the $NF_3$ gas and the FNO gas exist together in the processing chamber 201 so that an etching rate by the $NF_3$ gas can be increased.

Here, the $N_2$ gas may be supplied from the $N_2$ gas supply source 273 serving as the inert gas supply source into the processing chamber 201 so that each of the gas containing the FNO and the $NF_3$ gas can be diluted with the $N_2$ gas. For example, by opening the valves 262c, 261c, 262d, and 261d, the $N_2$ gas supplied from the $N_2$ gas supply source 273 into each of the inert gas supply pipes 232c and 232d is controlled to a desired flow rate by each of the MFCs 241c and 241d, passes through each of the inert gas supply pipes 232c and 232d, and is introduced from each of the nozzles 230a and 230b into the processing chamber 201 via each of the processing gas supply pipes 232a and 232b. The $N_2$ gas is mixed with the $NF_3$ gas and the FNO-containing gas inside each of the processing gas supply pipes 232a and 232b. The concentrations of the FNO-containing gas and the $NF_3$ gas may be controlled by adjusting the flow rate of the supplied $N_2$ gas. Also, in addition to the $N_2$ gas, a noble gas such as an argon (Ar) gas and a helium (He) gas may be used to dilute the FNO-containing gas and the $NF_3$ gas.

Meanwhile, the thin film is etched during the cleaning process under the following exemplary conditions:

Temperature in the processing chamber: 200 to 600° C.,

Pressure in the processing chamber: 133 Pa (1 Torr) to 66,500 Pa (500 Torr),

Temperature in the preliminary decomposition chamber: 500 to 800° C.,

Pressure in the preliminary decomposition chamber: 133 Pa (1 Torr) to atmospheric pressure (760 Torr), Supply flow rate of the $NF_3$ gas: 200 sccm (0.2 slm) to 4,000 sccm (4 slm), Supply flow rate of the NO gas: 200 sccm (0.2 slm) to 4,000 sccm (4 slm), Supply flow rate of the $N_2$ gas: 500 sccm (0.5 slm) to 20,000 sccm (20 slm).

The etching of the thin film is performed by maintaining the respective etching conditions constant within the respective ranges.

After a predetermined etching time has elapsed, the etching of the processing chamber 201 is terminated by closing the valves 262e, 261e, 262f, 261f, 262g, and 261g to stop the supply of the FNO-containing gas and the $NF_3$ gas into the processing chamber 201. Thereafter, the valves 262c, 261c, 262d, and 261d are opened and the inside of the processing chamber 201 is purged by supplying the $N_2$ gas from the $N_2$ gas supply source 273 into the processing chamber 201 and exhausting the $N_2$ gas through the exhaust pipe 231. An inner atmosphere of the processing chamber 201 is replaced with the $N_2$ gas to return the inner pressure of the processing chamber 201 to an atmospheric pressure, thereby terminating the cleaning process according to the present embodiment.

When the cleaning process is terminated, the seasoning process of pre-coating the thin film inside the processing chamber 201 is performed. Thereafter, the above-described thin-film forming process is resumed.

(4) Effects According to the Embodiment

According to the embodiment, one or more following effects are obtained.

According to the embodiment, with the processed wafer 200 discharged from the processing chamber 201, the gas containing FNO generated by pre-mixing the $F_2$ gas obtained by preliminarily decomposing the $NF_3$ gas and the NO gas is supplied from the first cleaning gas supply system into the processing chamber 201 and the same is exhausted and simultaneously, the $NF_3$ gas is supplied from the second cleaning gas supply system installed apart from the first cleaning gas supply system and the same is exhausted. That is, during the cleaning process, the FNO-containing gas is mixed (post-mixed) with the $NF_3$ gas to cause a state where the $NF_3$ gas and the FNO gas exist together in the processing chamber 201. Since the FNO accelerates the etching reaction by the $NF_3$ gas, the etching rate can be increased to improve the cleaning performance. Moreover, by causing a state where the $NF_3$ gas and the FNO gas exist together in the processing chamber 201, processing conditions such as the temperature and the pressure may be adjusted to a low temperature and a low pressure. For example, even if the inside of the processing chamber 201 is adjusted to a temperature of about 400° C. under a pressure of about 100 Torr, the cleaning process may be sufficiently performed. Further, it is confirmed that the etching process is not facilitated due to the low etching rate of the FNO gas when only the FNO gas is supplied into the processing chamber 201 instead of the mixture of the $NF_3$ gas and the FNO gas. That is, it has been identified that, the etching process is not facilitated when only the FNO gas is used although the FNO gas added to the cleaning gas accelerates the etching reaction by the cleaning gas.

In addition, according to the embodiment, the $NF_3$ gas is decomposed into the $F_2$ gas and the $N_2$ gas in the preliminary decomposition chamber 280f, and the $F_2$ gas is mixed with the NO gas in the first cleaning gas supply pipe 232h. In other words, in accordance with the embodiment, the $F_2$ gas and the NO gas are mixed in advance (pre-mixed) with each other in the first cleaning gas supply pipe 232h instead of separately supplying each of the $F_2$ gas and the NO gas into the processing chamber 201. Thus, by pre-mixing the $F_2$ gas and the NO gas in the first cleaning gas supply pipe 232h, the generation efficiency of FNO can be improved.

As described above, according to the embodiment, when the cleaning process is performed by adding the NO gas to the gas containing F atoms, the handling can be facilitated, and the controllability of the cleaning performance can be improved.

In addition, according to the embodiment, the NO gas is used as an oxygen-containing gas to be mixed with the $F_2$ gas to improve the generation efficiency of the FNO. Further, when an $N_2O$ gas or an $NO_2$ gas is used as the oxygen-containing gas instead of the NO gas, a dedicated preliminary decomposition chamber, that is, a preliminary decomposition chamber only for the $N_2O$ gas or the $NO_2$ gas is required due to a low reactivity of the $N_2O$ gas and $NO_2$ gas with the fluorine-containing gas. On the contrary, since the NO gas sufficiently reacts with the $F_2$ gas in the first cleaning gas supply pipe 232h, it is unnecessary to install the dedicated preliminary decomposition chamber, that is, the preliminary decomposition chamber only for the NO gas. Furthermore, when an $O_2$ gas is used as the oxygen-containing gas instead of the NO gas, FNO is not generated.

In addition, according to the present embodiment, the FNO-containing gas is mixed with the $NF_3$ gas in the processing chamber 201 to generate the mixture of the $NF_3$ gas and the FNO gas so that the silicon nitride film can be etched more than quartz. Thus, damage to the quartz member [the process tube 203 and the boat 217, etc.] in the processing chamber 201 can be reduced. Moreover, since the FNO gas etches an oxide layer such as a $SiO_2$ layer, it is likely that quartz members are corroded by the FNO gas. However, by generating the mixture of the FNO gas and the $NF_3$ gas by mixing the FNO-containing gas with the $NF_3$ gas in the processing chamber 201, the etching of the silicon nitride layer can be facilitated, the etching of the quartz members can be suppressed, and the corrosion of the quartz members, namely, the damage to the quartz members, can be reduced.

While the present invention has been particularly described with reference to the embodiments thereof, the present invention is not limited thereto and changes may be made thereto without departing from the spirit and the scope of the invention.

For instance, a gas highly reactive to the NO gas, for example, the $F_2$ gas or a chlorine fluoride gas such as a chlorine trifluoride ($ClF_3$) gas, may be used instead of the $NF_3$ gas as the gas containing F atoms to be mixed with the NO gas. In this case, a decomposition source, such as a plasma source or a heater is not required to be installed in the preliminary decomposition chamber 280f. In addition, as shown in FIG. 3, the preliminary decomposition chamber 280f is not required to be installed in the first cleaning gas supply system. Furthermore, even when the $F_2$ gas or the $ClF_3$ gas is used, the decomposition source or the preliminary decomposition chamber 280f may be installed, thereby further accelerating the decomposition of the fluorine-containing gas. Moreover, by elongating the flow path through which the $F_2$ gas generated by the preliminary decomposition or the directly supplied $F_2$ gas and the NO gas meet each other and flow into the processing chamber 201, reactivity between the gas containing F atoms and the NO gas can be further increased.

In accordance with the embodiment, the FNO gas may be generated by mixing in advance (pre-mixing) the gas containing F atoms, which is highly reactive with the NO gas, with the NO gas. In the cleaning process, the same effects as in the above-described embodiment can be obtained by generating a mixture of one of the $F_2$ gas and the $ClF_3$ gas and the FNO gas in the processing chamber 201.

In addition, the thin film is etched using the $F_2$ gas as the fluorine-containing gas during the cleaning process under the following exemplary conditions:

Temperature in the processing chamber: 200 to 500° C.,
Pressure in the processing chamber: 133 Pa (1 Torr) to 66,500 Pa (500 Torr),
Supply flow rate of the $F_2$ gas supply flow rate: 200 sccm (0.2 slm) to 4,000 sccm (4 slm),
Supply flow rate the NO gas: 200 sccm (0.2 slm) to 4,000 sccm (4 slm),
Supply flow rate of the $N_2$ gas: 500 sccm (0.5 slm) to 20,000 sccm (20 slm).

In addition, the thin film is etched using the $ClF_3$ gas as the fluorine-containing gas during the cleaning process under the following exemplary conditions:

Temperature in the processing chamber: 200 to 500° C.,
Pressure in the processing chamber: 133 Pa (1 Torr) to 66,500 Pa (500 Torr),
Supply flow rate of the $ClF_3$ gas: 200 sccm (0.2 slm) to 2,000 sccm (2 slm),
Supply flow rate of the NO gas: 200 sccm (0.2 slm) to 2,000 sccm (2 slm),
Supply flow rate of the $N_2$ gas: 500 sccm (0.5 slm) to 20,000 sccm (20 slm).

Since the $F_2$ gas has a very high reactivity and care is required when handling the $F_2$ gas, charging a cylinder with the gas under a high pressure is impossible in view of safety. Accordingly, a charging pressure is limited to several bars at maximum in terms of a partial pressure of $F_2$ gas. For this reason, when the gas is supplied from the cylinder, it is difficult to perform a long cleaning process or to clean a plurality of film-forming apparatuses at the same time. Moreover, a frequent change of the cylinders is required resulting in an increase in a possibility of a gas leakage. While the above-described problem may be avoided by synthesizing the $F_2$ gas on the spot, highly expensive accessory equipment is required, and scrupulous care should be taken to prepare the $F_2$ gas by electrolyzing a hydrogen fluoride (HF) having a high reactivity. Further, the HF may serve to corrode pipes, etc.

In addition, since the $ClF_3$ has high reactivity and is in a liquid form at room temperature and has a very low allowable concentration (critical value) of about 0.1 ppm in an atmosphere, the use of the $ClF_3$ gas is outlawed in some countries. Further, since an initial pressure is very low at room temperature, a supply of a large amount of $ClF_3$ gas involves accelerating an evaporation of the $ClF_3$ gas by an external heating. Accordingly, high-priced accessory equipment is required. Further, when the $ClF_3$ gas is re-liquefied in the pipes, the pipes may be corroded.

By comparison, while the $NF_3$ gas is a strong oxidizer, the $NF_3$ gas is extremely inactive and non-flammable about room temperature. Since the allowable concentration of the $NF_3$ gas in the atmosphere has a critical value of about 30 ppm, which is much higher than that (1 ppm) of $F_2$ gas, the $NF_3$ gas is less toxic than the $F_2$ gas. In addition, a supply of a large amount of the $NF_3$ gas by the cylinder is possible and the large amount of the $NF_3$ gas is consumed in recent semiconductor manufacturing processes.

As described above, the $NF_3$ gas is chemically more stable, less toxic, and easier to handle compared to the $F_2$ gas and the $ClF_2$ gas. In this respect, it can be seen that the above-described embodiment in which the $NF_3$ gas is used as the fluorine-containing gas is advantageous, for example, over the other embodiments.

In addition, a perfluorocarbon (PFC) gas, namely, a fluorocarbon gas such as a $CF_4$ gas, a $C_2F_6$ gas, or a $C_3F_8$ gas may be used instead of the $NF_3$ gas as the gas containing F atoms to be mixed with the NO gas. In this case, the PFC gas is preliminarily decomposed by the decomposition source such as the plasma source and the heater in the preliminary decomposition chamber 280$f$. Moreover, the PFC gas is more difficult to be decomposed thermally and is thermally decomposed at a higher temperature compared to the $NF_3$ gas. Accordingly, the thermal decomposition of the PFC gas involves applying a heat at a relatively high temperature and is preferably performed using plasma. Preferably, the PFC gas is preliminarily decomposed by the plasma source in the preliminary decomposition chamber 280$f$.

In addition, when the PFC gas (for example, the $CF_4$ gas) is preliminarily decomposed to generate the $F_2$ gas, it is preferable that $O_2$ added to prevent the decomposed $F_2$ gas from reverting back to the $CF_4$ gas. That is, it is preferable that a gas obtained by adding the $O_2$ to the $CF_4$ gas is preliminarily decomposed by the plasma source in the preliminary decomposition chamber 280$f$. Moreover, by elongating the flow path through which the $F_2$ gas generated by the preliminary decomposition as in the above-described embodiment and the NO gas meet each other and flow into the processing chamber 201, reactivity between the gas containing F atoms and the NO gas can be further increased.

In accordance with the embodiment, the gas obtained by preliminarily decomposing the PFC gas serving as the gas containing F atoms is mixed in advance (pre-mixed) with the NO gas, thereby generating FNO. In the cleaning process, the same effects as in the above-described embodiment can be obtained by generating a mixture of the PFC gas and the FNO gas in the processing chamber 201.

In addition, the thin film is etched using the $CF_4$ gas as the fluorine-containing gas during the cleaning process under the following exemplary conditions:

Temperature in processing chamber: 200 to 600° C.,
Pressure in processing chamber: 133 Pa (1 Torr) to 66,500 Pa (500 Torr),
Supply flow rate of the mixture of the $CF_4$ gas and the $O_2$: 200 sccm (0.2 slm) to 4,000 sccm (4 slm),
Supply flow rate of the NO gas: 200 sccm (0.2 slm) to 4,000 sccm (4 slm),
Supply flow rate of the $N_2$ gas: 500 sccm (0.5 slm) to 20,000 sccm (20 slm).

Furthermore, in the PFC gas, the $CF_4$ gas and the $C_2F_6$ gas [aliphatic hydrocarbon completely saturated with fluorine] having molecular structures that are free from double bonds are highly stable gases and do not easily cause chemical reactions because the $CF_4$ gas and the $C_2F_6$ gas have at least twice the molecule bonding energy compared to the $NF_3$ gas. However, a difficult point may be that the $CF_4$ gas and the $C_2F_6$ gas have very high global warming factors (GWFs) due to their stability.

Hereinafter, preferred embodiments of the present invention will be further described in detail.

An embodiment of the present invention provides a substrate processing apparatus including:

a processing vessel configured to process a substrate;

a processing gas supply system configured to supply a processing gas into the processing vessel;

a first cleaning gas supply system configured to supply a pre-mixed gas including a fluorine-containing gas and a nitrogen monoxide gas into the processing vessel;

a second cleaning gas supply system installed apart from the first cleaning gas supply system and configured to supply the fluorine-containing gas into the processing vessel; and a controller configured to control the processing gas supply system, the first cleaning gas supply system, and the second cleaning gas supply system in a manner that the processing gas is supplied into the processing vessel accommodating the substrate to form a thin film on the substrate, and that the pre-mixed gas and the fluorine-containing gas is supplied into the processing vessel through the first cleaning gas supply system and the second cleaning gas supply system respectively so as to remove a deposit containing the thin film adhered to an inside of the processing vessel.

Another embodiment of the present invention provides a substrate processing apparatus including:

a processing vessel configured to process a substrate;

a processing gas supply system configured to supply a processing gas into the processing vessel;

a first cleaning gas supply system comprising a preliminary decomposition chamber for decomposing a fluorine-containing gas, the first cleaning gas supply system configured to supply a pre-mixed gas including a gas obtained from decomposing the fluorine-containing gas in the preliminary decomposition chamber and a nitrogen monoxide gas into the processing vessel;

a second cleaning gas supply system installed apart from the first cleaning gas supply system and configured to supply the fluorine-containing gas into the processing vessel; and a controller configured to control the processing gas supply system, the first cleaning gas supply system, and the second cleaning gas supply system in a manner that the processing gas is supplied into the processing vessel accommodating the substrate to form a thin film on the substrate, and that the pre-mixed gas and the fluorine-containing gas is supplied into the processing vessel through the first cleaning gas supply system and the second cleaning gas supply system respectively so as to remove a deposit containing the thin film adhered to an inside of the processing vessel.

Preferably, the pre-mixed gas includes a FNO gas generated by reaction of the fluorine-containing gas and the nitrogen monoxide gas in the first cleaning gas supply system.

Preferably, the pre-mixed gas includes a FNO gas generated by reaction of the gas obtained from decomposing the fluorine-containing gas and the nitrogen monoxide gas in the second cleaning gas supply system.

Preferably, the fluorine-containing gas is a fluorine gas or a chlorine fluoride gas.

Preferably, the fluorine-containing gas is a nitrogen fluoride gas or a fluorocarbon gas.

Still another embodiment of the present invention provides a method of manufacturing a semiconductor device, including:

supplying a processing gas into a processing vessel accommodating a substrate to form a thin film on the substrate; and supplying a pre-mixed gas including a fluorine-containing gas and a nitrogen monoxide gas into the processing vessel through a first cleaning gas supply system while simultaneously supplying the fluorine-containing gas into the processing vessel through a second cleaning gas supply system installed apart from the first cleaning gas supply system so as to remove a deposit containing the thin film adhered to an inside of the processing vessel.

Yet another embodiment of the present invention provides a method of manufacturing a semiconductor device, including:

supplying a processing gas into a processing vessel accommodating a substrate to form a thin film on the substrate; and supplying a pre-mixed gas including a gas obtained from decomposing a fluorine-containing gas in a preliminary decomposition chamber and a nitrogen monoxide gas into the processing vessel through a first cleaning gas supply system while simultaneously supplying the fluorine-containing gas into the processing vessel through a second cleaning gas supply system installed apart from the first cleaning gas supply system so as to remove a deposit containing the thin film adhered to an inside of the processing vessel.

Yet another embodiment of the present invention provides method of cleaning an inside of a processing vessel including:

providing the processing vessel configured to process a substrate to form a thin film thereon; and supplying a pre-mixed gas including a fluorine-containing gas and a nitrogen monoxide gas into the processing vessel through a first cleaning gas supply system while simultaneously supplying the fluorine-containing gas into the processing vessel through a second cleaning gas supply system installed apart from the first cleaning gas supply system so as to remove a deposit containing the thin film adhered to the inside of the processing vessel.

Yet another embodiment of the present invention provides a method of cleaning an inside of a processing vessel including:

providing the processing vessel configured to process a substrate to form a thin film thereon; and supplying a pre-mixed gas including a gas obtained from decomposing a fluorine-containing gas in a preliminary decomposition chamber and a nitrogen monoxide gas into the processing vessel through a first cleaning gas supply system while simultaneously supplying the fluorine-containing gas into the processing vessel through a second cleaning gas supply system installed apart from the first cleaning gas supply system so as to remove a deposit containing the thin film adhered to the inside of the processing vessel.

What is claimed is:

1. A method of manufacturing a semiconductor device, comprising:

(a) supplying a processing gas into a processing vessel accommodating a substrate to form a thin film on the substrate;

(b) supplying a fluorine-containing gas and a nitrogen monoxide gas into a first cleaning gas supply system and mixing the fluorine-containing gas with the nitrogen monoxide gas in the first cleaning gas supply system to generate an FNO gas; and (c) supplying the FNO gas into the processing vessel through the first cleaning gas supply system while simultaneously supplying the fluorine-containing gas into the processing vessel through a second cleaning gas supply system installed apart from the first cleaning gas supply system without supplying the nitrogen monoxide gas into the processing vessel through the second cleaning gas supply system, and mixing the FNO gas with the fluorine-containing gas in the processing vessel so as to remove a deposit containing the thin film adhered to an inside of the processing vessel.

2. The method of claim 1, wherein the step (b) comprises mixing and reacting the fluorine-containing gas with the nitrogen monoxide gas in a pipe installed in the first cleaning gas supply system to generate the FNO gas in the pipe.

3. The method of claim 1, wherein the step (b) comprises mixing and reacting the fluorine-containing gas with the nitrogen monoxide gas in a mixing pipe whereat a pipe installed in the first cleaning gas supply system to supply the fluorine-containing gas is joined with a pipe installed in the first cleaning gas supply system to supply the nitrogen monoxide gas to generate the FNO gas in the mixing pipe.

4. The method of claim 1, wherein the step (c) comprises separately supplying the FNO gas supplied through the first cleaning gas supply system and the fluorine-containing gas supplied through the second cleaning gas supply system into the processing vessel through two separate nozzles.

5. The method of claim 1, wherein the step (c) comprises directly supplying the FNO gas into the processing vessel through a first nozzle connected to the first cleaning gas supply system and simultaneously directly supplying the fluorine-containing gas into the processing vessel through a second nozzle connected to the second cleaning gas supply system, the second nozzle being installed apart from the first nozzle.

6. The method of claim 1, wherein the step (c) comprises first mixing the FNO gas supplied through the first cleaning gas supply system and the fluorine-containing gas supplied thorough the second cleaning gas supply system in the processing vessel.

7. The method of claim 1, wherein the step (c) comprises making a state that the FNO gas supplied through the first cleaning gas supply system and the fluorine-containing gas supplied thorough the second cleaning gas supply system are co-existed in the processing vessel.

8. The method of claim 1, the step (c) comprises supplying an inert gas into the processing vessel.

9. The method of claim 1, wherein the fluorine-containing gas comprises one of a fluorine gas, a chlorine fluoride gas, a nitrogen fluoride gas and a fluorocarbon gas.

10. A method of cleaning an inside of a processing vessel comprising:
  (a) providing the processing vessel configured to process a substrate to form a thin film thereon; and
  (b) supplying a fluorine-containing gas and a nitrogen monoxide gas into a first cleaning gas supply system and mixing the fluorine-containing gas with the nitrogen monoxide gas in the first cleaning gas supply system to generate an FNO gas; and
  (c) supplying the FNO gas into the processing vessel through the first cleaning gas supply system while simultaneously supplying the fluorine-containing gas into the processing vessel through a second cleaning gas supply system installed apart from the first cleaning gas supply system without supplying the nitrogen monoxide gas into the processing vessel through the second cleaning gas supply system, and mixing the FNO gas with the fluorine-containing gas in the processing vessel so as to remove a deposit containing the thin film adhered to an inside of the processing vessel.

* * * * *